(12) United States Patent
Mathew et al.

(10) Patent No.: US 8,078,662 B2
(45) Date of Patent: Dec. 13, 2011

(54) MULTIPLIER PRODUCT GENERATION BASED ON ENCODED DATA FROM ADDRESSABLE LOCATION

(75) Inventors: Sanu Mathew, Hillsboro, OR (US); Vishak Venkatraman, Amherst, MA (US); Steven K. Hsu, Lake Oswego, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1404 days.

(21) Appl. No.: 11/540,346

(22) Filed: Sep. 29, 2006

(65) Prior Publication Data

US 2008/0098278 A1 Apr. 24, 2008

(51) Int. Cl.
*G06F 7/533* (2006.01)
(52) U.S. Cl. .................................................... 708/628
(58) Field of Classification Search .................. None
See application file for complete search history.

(56) References Cited

U.S. PATENT DOCUMENTS

| | | | |
|---|---|---|---|
| 6,032,170 A * | 2/2000 | Guttag et al. ................. | 708/620 |
| 6,301,599 B1 * | 10/2001 | Chehrazi et al. ............. | 708/628 |
| 6,571,269 B1 | 5/2003 | Krishnamurthy et al. | |
| 7,131,055 B2 | 10/2006 | Mathew et al. | |
| 7,188,134 B2 | 3/2007 | Mathew et al. | |
| 7,325,024 B2 | 1/2008 | Mathew et al. | |
| 7,380,099 B2 | 5/2008 | Mathew et al. | |
| 7,509,368 B2 | 3/2009 | Anders et al. | |
| 7,519,648 B2 | 4/2009 | Rhee | |
| 7,693,925 B2 | 4/2010 | Mathew et al. | |
| 7,693,926 B2 | 4/2010 | Mathew et al. | |
| 2003/0005016 A1 * | 1/2003 | Tzeng et al. ................. | 708/628 |
| 2003/0158880 A1 * | 8/2003 | Ng ................................ | 708/628 |
| 2004/0220993 A1 | 11/2004 | Mathew et al. | |
| 2004/0220994 A1 | 11/2004 | Mathew et al. | |
| 2007/0233760 A1 | 10/2007 | Mathew et al. | |
| 2007/0244954 A1 * | 10/2007 | Belluomini et al. .......... | 708/628 |
| 2007/0299902 A1 | 12/2007 | Kumashikar et al. | |

FOREIGN PATENT DOCUMENTS

| JP | 2004-227248 A | 8/2004 |
|---|---|---|
| KR | 10-2005-0081407 A | 8/2005 |

OTHER PUBLICATIONS

Patent Abstracts of Japan, Japanese Publication No. 2004-227248, 1 page (Aug. 12, 2004).
Carley, L.R., et al., "Decreasing Low-Voltage Manufacturing-Induced Delay Variations with Adaptive Mixed-Voltage-Swing Circuits", Proceedings of the 1998 International Symposium on Low Power Electronics and Design (ISLPED), pp. 106-108 (Aug. 10-12, 1998).

(Continued)

Primary Examiner — David H Malzahn
(74) Attorney, Agent, or Firm — Matthew C. Fagan

(57) ABSTRACT

For one disclosed embodiment, an apparatus comprises first circuitry to output encoded data from an addressable location based at least in part on an address corresponding to a first number, wherein the encoded data is based at least in part on data that corresponds to the first number and that is encoded for partial product reduction, and second circuitry to generate a product based at least in part on the encoded data and on data corresponding to a second number. Other embodiments are also disclosed.

20 Claims, 7 Drawing Sheets

OTHER PUBLICATIONS

Harris, D., et al., "An Improved Unified Scalable Radix-2 Montgomery Multiplier", Proceedings of the 17th IEEE Symposium on Computer Arithmetic (ARITH'05), pp. 172-178 (Jun. 27-29, 2005).

Hsu, S., et al., "A 110 GOPS/W16b Multiplier and Reconfigurable PLA Loop in 90-nm CMOS", IEEE International Solid-State Circuits Conference (ISSCC), Digest of Technical Papers, pp. 376-377, 604 (Feb. 9, 2005).

Hsu, S., et al., "A 2GHz 13.6mW 12x9b Multiplier for Energy Efficient FFT Accelerators", Proceedings of the 31st European Solid-State Circuits Conference (ESSCIRC), pp. 199-202 (Sep. 12-16, 2005).

Hsu, S.K., et al., "A 110 GOPS/W 16-bit Multiplier and Reconfigurable PLA Loop in 90-nm CMOS", IEEE Journal of Solid-State Circuits, vol. 41, No. 1, pp. 256-264 (Jan. 2006).

Knagge, G., "Booth Recoding", ASIC Design for Signal Processing, 5 pages (2003).

Krishnamurthy, R.K., et al., "A Low-Power 16-bit Multiplier-Accumulator Using Series-Regulated Mixed Swing Techniques", Proceedings of the IEEE 1998 Custom Integrated Circuits Conference, pp. 499-502 (May 11-14, 1998).

Mathew, S., et al., "Advanced Circuit Techniques for High-Performance Microprocessor and Low-Power DSPs", Proceedings of the 2004 IEEE Dallas/CAS Workshop, Implementation of High Performance Circuits, pp. 1-45 (Sep. 27, 2004).

Zeydel, B.R., et al., "A 90nm 1GHz 22mW 16x16-bit 2's Complement Multiplier for Wireless Baseband", 2003 Syposium on VLSI Circuits, Digest of Technical Papers, pp. 235-236 (Jun. 12-14, 2003).

* cited by examiner

_(54)_ MULTIPLIER PRODUCT GENERATION BASED ON ENCODED DATA FROM ADDRESSABLE LOCATION

FIELD

Embodiments described herein generally relate to multipliers.

BACKGROUND

A processor can have a multiplier circuit to help speed the generation of products of numbers. A processor can use a multiplier circuit, for example, to help speed performance of digital signal processing (DSP) applications such as, for example, finite impulse response (FIR) filters, infinite impulse response (IIR) filters, discrete cosine transforms (DCTs), and/or fast Fourier transforms (FFTs). A processor can have parallel clusters of multiplier, multiply-add, and/or multiply-accumulate circuits to help speed performance of complex filter operations, for example.

BRIEF DESCRIPTION OF THE DRAWINGS

Embodiments are illustrated by way of example and not limitation in the figures of the accompanying drawings, in which like references indicate similar elements and in which.

The figures of the drawings are not necessarily drawn to scale.

DETAILED DESCRIPTION

The following detailed description sets forth example embodiments of apparatuses, methods, and systems relating to multiplier product generation based on encoded data from addressable location. Features, such as structure(s), function(s), and/or characteristic(s) for example, are described with reference to one embodiment as a matter of convenience; various embodiments may be implemented with any suitable one or more described features.

Figure 1:
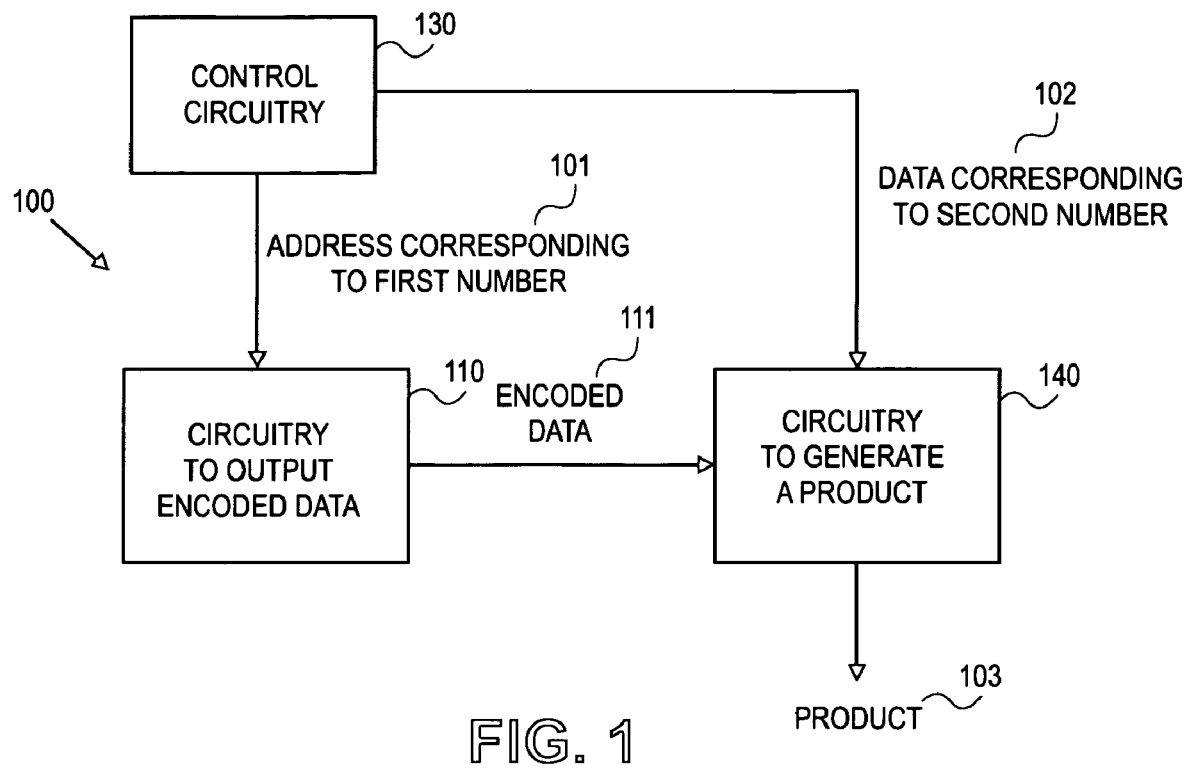
FIG. 1 illustrates, for one embodiment, a block diagram of circuitry to generate a product based at least in part on encoded data from an addressable location.

FIG. 1 illustrates circuitry 100 to generate a product based at least in part on encoded data from an addressable location. Circuitry 100 for one embodiment, as illustrated in FIG. 1, may include circuitry 110 to output encoded data 111 from an addressable location based at least in part on an address 101 corresponding to a first number and circuitry 140 to generate a product 103 based at least in part on encoded data 111 and on data 102 corresponding to a second number. Encoded data 111 for one embodiment may be based at least in part on data that corresponds to the first number and that is encoded for partial product reduction. Circuitry 140 for one embodiment may generate a product of the first number and the second number. For one embodiment, the first number may be a multiplier and the second number may be a multiplicand. For another embodiment, the first number may be a multiplicand and the second number may be a multiplier.

Circuitry 110 for one embodiment may be used to output encoded data 111 from an addressable location based at least in part on an address 101 corresponding to the first number to help reduce or avoid having to encode the same data repeatedly for partial product reduction. Circuitry 110 for one embodiment may be used to output encoded data to help speed performance of product generation. Circuitry 110 for one embodiment may be used to output encoded data to help reduce power consumption and/or heat dissipation. Circuitry 110 for one embodiment may be used to help speed performance and/or to help reduce power consumption and/or heat dissipation particularly where circuitry 110 is used to output encoded data 111 for a multiplier that is a constant and that is to be repeatedly multiplied with different multiplicands.

Figure 2:
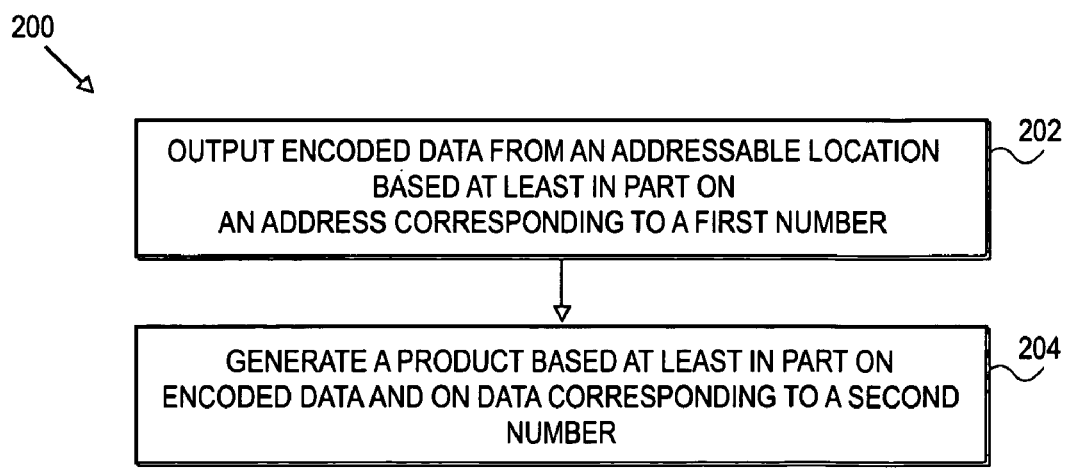
FIG. 2 illustrates, for one embodiment, a flow diagram to generate a product based at least in part on encoded data from an addressable location.

FIG. 2 illustrates, for one embodiment, a flow diagram 200 to generate a product based at least in part on encoded data from an addressable location. For block 202 of FIG. 2, circuitry 110 may output encoded data 111 from an addressable location based at least in part on address 101 corresponding to the first number. For block 204, circuitry 140 may generate product 103 based at least in part on encoded data 111 and on data 102 corresponding to the second number.

Encoded data 111 may correspond to a first number of any suitable bit-length, may be based at least in part on data that is encoded for partial product reduction in any suitable manner, and may have any suitable size. Encoded data 111 for one embodiment may correspond, for example, to a 16-bit first number. Encoded data 111 for one embodiment may include any suitable number of sets of any suitable number of select bits for a first number of any suitable bit-length.

Encoded data 111 for one embodiment may be based at least in part on data that is encoded using Booth encoding or modified Booth encoding, such as radix-4 Booth (or modified Booth) encoding for example. Encoded data 111 for one embodiment may be the encoded data resulting from Booth encoding or modified Booth encoding of data corresponding to the first number. Encoded data 111 for one embodiment may be 48 bits in length, that is eight sets of six select bits, for a 16-bit number encoded using radix-4 Booth (or modified Booth) encoding.

Encoded data 111 for one embodiment may be encoded data resulting from further encoding of already encoded data. Such further encoding for one embodiment may be used, for example, to help compress encoded data. Encoded data 111 for one embodiment may be the encoded data resulting from further encoding of already encoded data using leading zeroes detection (LZD) or modified LZD. Encoded data 111 for one embodiment may be encoded data resulting from Booth encoding or modified Booth encoding of data corresponding to the first number and further encoding of such encoded data using LZD or modified LZD. For one embodiment where encoded data has eight sets of six select bits where each set has only one bit that is different from the other bits in the set, such as only one logic one bit in the set for example, LZD or modified LZD encoding may be used to encode the eight sets of six select bits into eight sets of three encoded select bits for a total of 24 bits for encoded data 111.

Circuitry 110 may be coupled to receive address 101 of any suitable bit-length from any suitable source. Circuitry 110 for one embodiment, as illustrated in FIG. 1, may be coupled to receive address 101 from control circuitry 130. Control circuitry 130 may comprise any suitable circuitry to control output of address 101 to circuitry 110 in any suitable manner. Control circuitry 130 for one embodiment may store address 101 in one or more registers. Control circuitry 130 for one embodiment may output address 101 to circuitry 110 in response to data corresponding to the first number. Control circuitry 130 for one embodiment may convert data corresponding to the first number to address 101.

Circuitry 140 may be coupled to receive data 102 of any suitable bit-length from any suitable source. Circuitry 140 for one embodiment, as illustrated in FIG. 1, may be coupled to receive data 102 from control circuitry 130. Control circuitry 130 may comprise any suitable circuitry to control output of data 102 to circuitry 140 in any suitable manner. Control circuitry 130 for one embodiment may store data 102 in one or more registers.

Control circuitry 130 for one embodiment may output data 102 to circuitry 140 as control circuitry 130 outputs address 101 to circuitry 110. Control circuitry 130 for one embodiment may output address 101 and data 102 so as to be available on the same clock edge. Control circuitry 130 for one embodiment may include programmable logic to output address 101 and/or data 102. Control circuitry 130 for one embodiment may output address 101 and/or data 102 in response to an instruction in order to execute the instruction.

Encoded Data Output Circuitry

Circuitry 110 may include any suitable circuitry to output encoded data 111 from an addressable location in any suitable manner.

Figure 3:
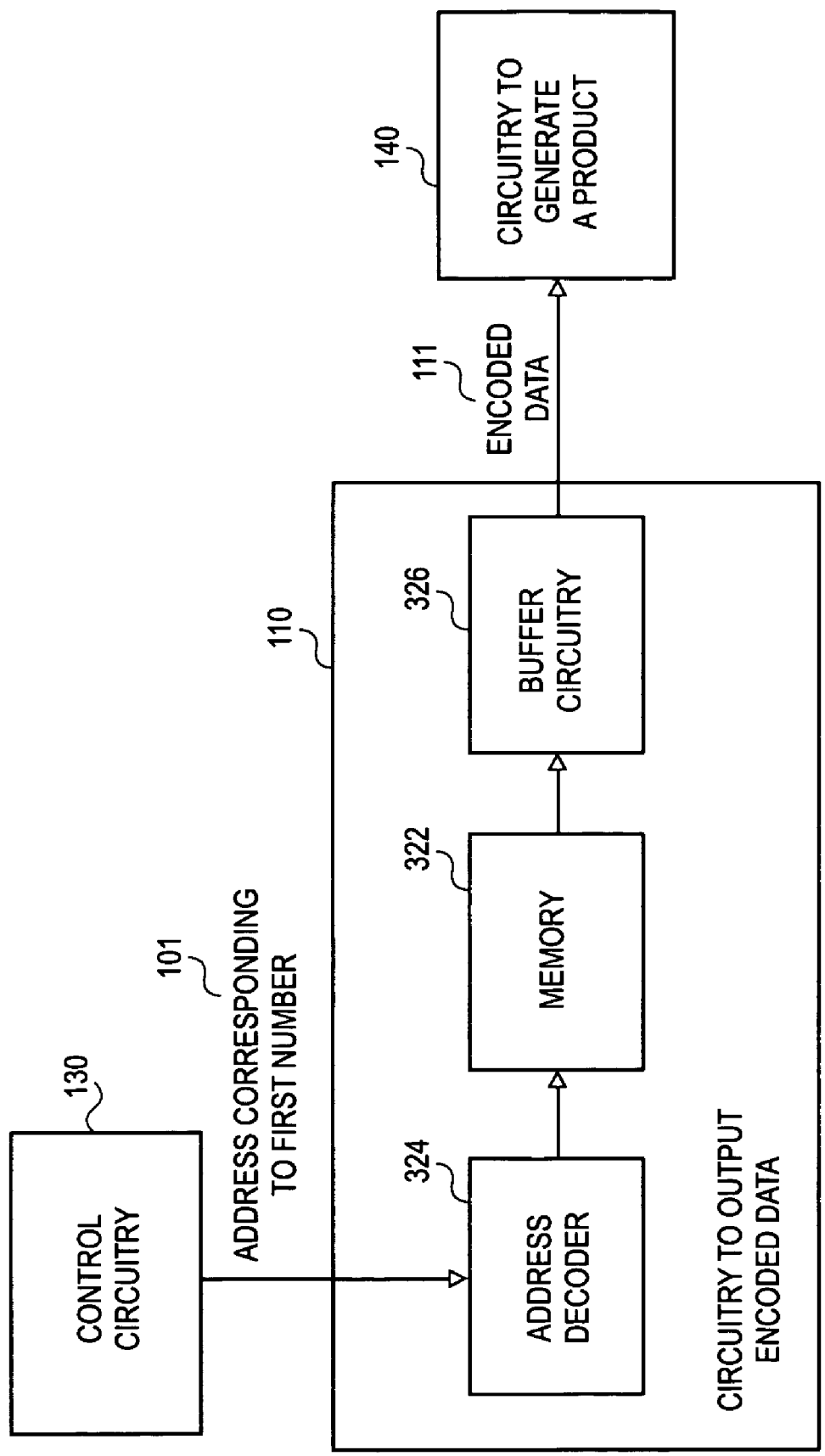
FIG. 3 illustrates, for one embodiment, a block diagram of circuitry to output encoded data from an addressable location.

Circuitry 110 for one embodiment, as illustrated in FIG. 3, may include a memory 322 to store encoded data corresponding to different numbers. Memory 322 may store any suitable amount of encoded data for any suitable numbers of any suitable bit-length. Memory 322 for one embodiment may be preloaded with encoded data corresponding to different numbers. Memory 322 for one embodiment may be loaded with encoded data corresponding to a number when that number is first used for product generation. Circuitry 110 for one embodiment may read encoded data from an addressable location in memory 322 based on address 101 and output such read encoded data to circuitry 140.

Memory 322 may be implemented using any suitable circuitry to store any suitable capacity of encoded data. Memory 322 may include circuitry for volatile memory and/or circuitry for non-volatile memory. Memory 322 may include, by way of example and not limitation, circuitry for a set of a plurality of registers, circuitry for any suitable read-only memory (ROM), circuitry for any suitable random access memory (RAM) such as a suitable static RAM or a suitable dynamic RAM for example, and/or circuitry for any suitable flash memory.

Circuitry 110 for one embodiment, as illustrated in FIG. 3, may include an address decoder 324 coupled to receive and decode at least a portion of a received address to read encoded data from memory 322. Circuitry 110 for another embodiment may not include address decoder 324 but rather may address memory 322 directly using a received address.

Circuitry 110 for one embodiment, as illustrated in FIG. 3, may include buffer circuitry 326 to output encoded data to circuitry 140. Buffer circuitry 326 may include any suitable circuitry coupled to receive encoded data from memory 322 and to store and/or output encoded data in any suitable manner. Buffer circuitry 326 for one embodiment may successively output portions of encoded data corresponding to a first number to circuitry 140. Buffer circuitry 326 for one embodiment may output all encoded data corresponding to a first number at once to circuitry 140.

Product Generation Circuitry

Circuitry 140 may include any suitable circuitry to generate product 103 of any suitable bit-length in any suitable manner based at least in part on encoded data 111 of any suitable bit-length and on data 102 of any suitable bit-length.

Figure 4:
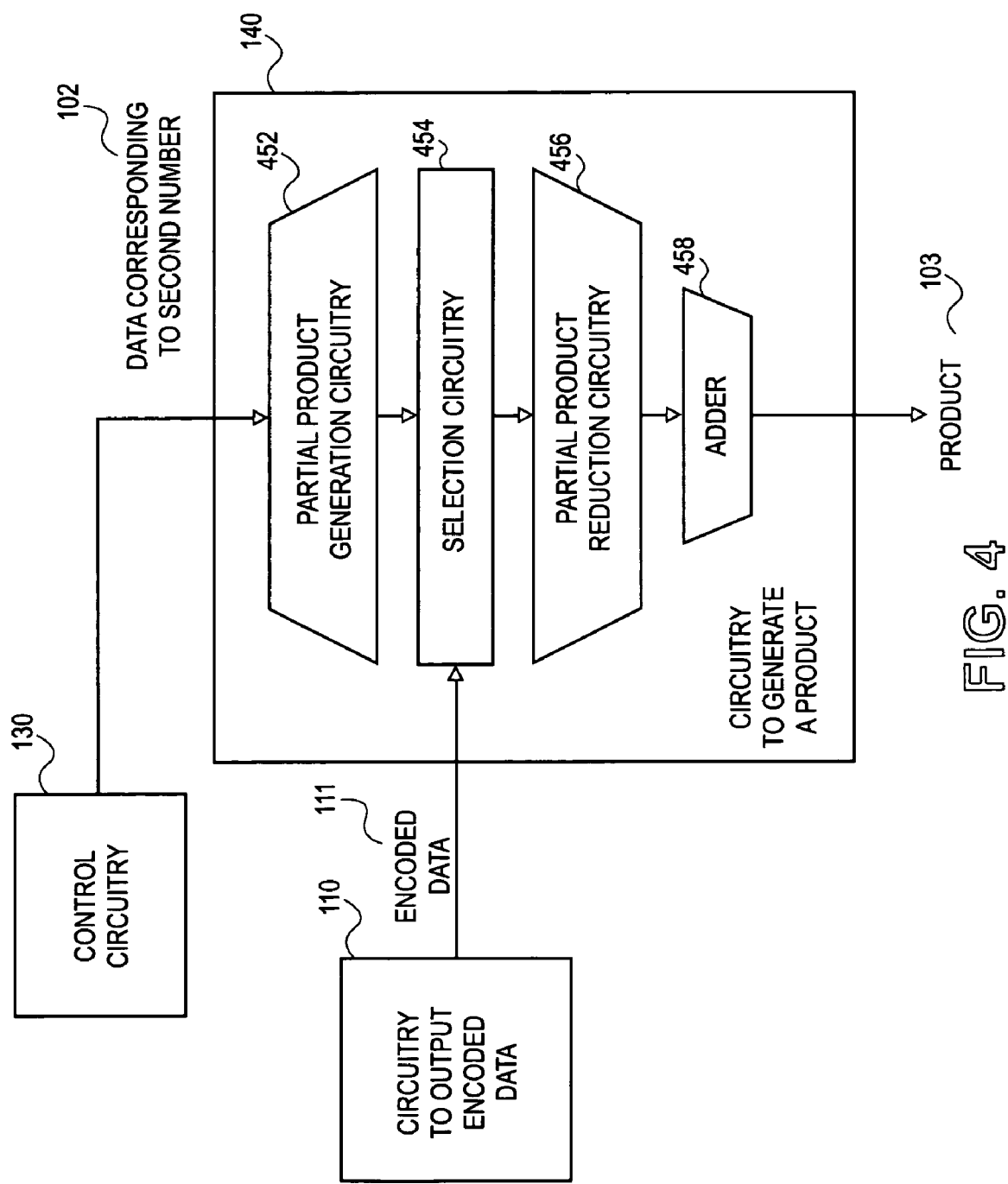
FIG. 4 illustrates, for one embodiment, a block diagram of circuitry to generate a product based at least in part on encoded data corresponding to a first number and data corresponding to a second number.

Circuitry 140 for one embodiment, as illustrated in FIG. 4, may include partial product generation circuitry 452 and selection circuitry 454.

Partial product generation circuitry 452 for one embodiment may generate data corresponding to different potential partial products for data 102 corresponding to the second number. Partial product generation circuitry 452 may include any suitable circuitry to generate any suitable data of any suitable bit-length in any suitable manner for data 102 of any suitable bit-length. Partial product generation circuitry 452 for one embodiment may generate data corresponding to potential partial products with sign extension.

Partial product generation circuitry 452 for one embodiment may generate data corresponding to one or more potential partial products based at least in part on data 102. Partial product generation circuitry 452 for one embodiment may be coupled to receive data 102. Partial product generation circuitry 452 for one embodiment may generate data corresponding to potential partial products in accordance with Booth (or modified Booth) encoding.

Partial product generation circuitry 452 for one embodiment may generate, for example, data corresponding to all logical zeros, data corresponding to all logical ones, data corresponding to the second number, data corresponding to two times the second number, data corresponding to the two's complement of the second number, and/or data corresponding to the two's complement of the product of two times the second number. Partial product generation circuitry 452 for one embodiment may generate, for example, 17-bit potential partial products in accordance with Booth (or modified Booth) encoding with sign extension for a 16-bit second number, for example.

Selection circuitry 454 for one embodiment may be coupled to select a potential partial product from partial product generation circuitry 452. Selection circuitry 454 for one embodiment may select a potential partial product based at least in part on encoded data 111 output from circuitry 110. Selection circuitry 454 for one embodiment may select a potential partial product based on a set of select bits of encoded data 111 output from circuitry 110. Selection circuitry 454 for one embodiment, as illustrated in FIG. 4, may be coupled to receive encoded data 111 from circuitry 110. Selection circuitry 454 may include any suitable circuitry to select a potential partial product from partial product generation circuitry 452 in any suitable manner. For one embodiment where partial product generation circuitry 452 may generate and output a plurality of potential partial products at one time, selection circuitry 454 for one embodiment may select from such output potential partial products. Selection circuitry 454 for one embodiment may include suitable multiplexing circuitry.

Partial product generation circuitry 452 for one embodiment may generate and output at one time six potential partial products for data 102: data corresponding to all logical zeros, data corresponding to all logical ones, data corresponding to the second number, data corresponding to two times the second number, data corresponding to the two's complement of the second number, and data corresponding to the two's complement of the product of two times the second number. Selection circuitry 454 for one embodiment may select one such output potential partial product based on encoded data 111. Encoded data 111 for one embodiment may include a set of six select bits one of which is different from the others to select one of six potential partial products. Encoded data 111 for one embodiment may include a set of three select bits to select one of six potential partial products.

Circuitry 140 for one embodiment, as illustrated in FIG. 4, may include partial product reduction circuitry 456 and adder 458.

Partial product reduction circuitry 456 for one embodiment may compress partial products. Partial product reduction circuitry 456 for one embodiment may be coupled to receive partial products selected from selection circuitry 454. Partial product reduction circuitry 456 may include any suitable circuitry to compress partial products of any suitable bit-length in any suitable manner to generate any suitable outputs of any suitable bit-length. Partial product reduction circuitry 456 for one embodiment may compress partial products to generate outputs in carry-save format. For one embodiment where encoded data 111 for a first number includes, for example, eight sets of select bits to select eight partial products using selection circuitry 454, partial product reduction circuitry 456 may compress eight partial products to generate two outputs. Partial product reduction circuitry 456 for one embodiment may compress, for example, eight 17-bit partial products to generate, for example, two 32-bit outputs.

Adder 458 for one embodiment may add outputs from partial product reduction circuitry 456 to generate product 103. Adder 458 for one embodiment may be coupled to receive outputs from partial product reduction circuitry 456. Adder 458 may include any suitable circuitry to add outputs of any suitable bit-length in any suitable manner to generate product 103 in any suitable form of any suitable bit-length. Adder 458 for one embodiment may be a carry propagate adder. Adder 458 for one embodiment may add outputs to generate product 103 in two's complement form. Adder 458 for one embodiment may add, for example, 32-bit outputs from partial product reduction circuitry 456 to generate, for example, a 32-bit product 103.

Data Encoding Circuitry

Circuitry 110 for one embodiment may include encoding circuitry to encode data corresponding to a first number and to store encoded data at an addressable location for future use. Circuitry 110 for one embodiment may include any suitable encoding circuitry to encode data in any suitable manner.

Figure 5:
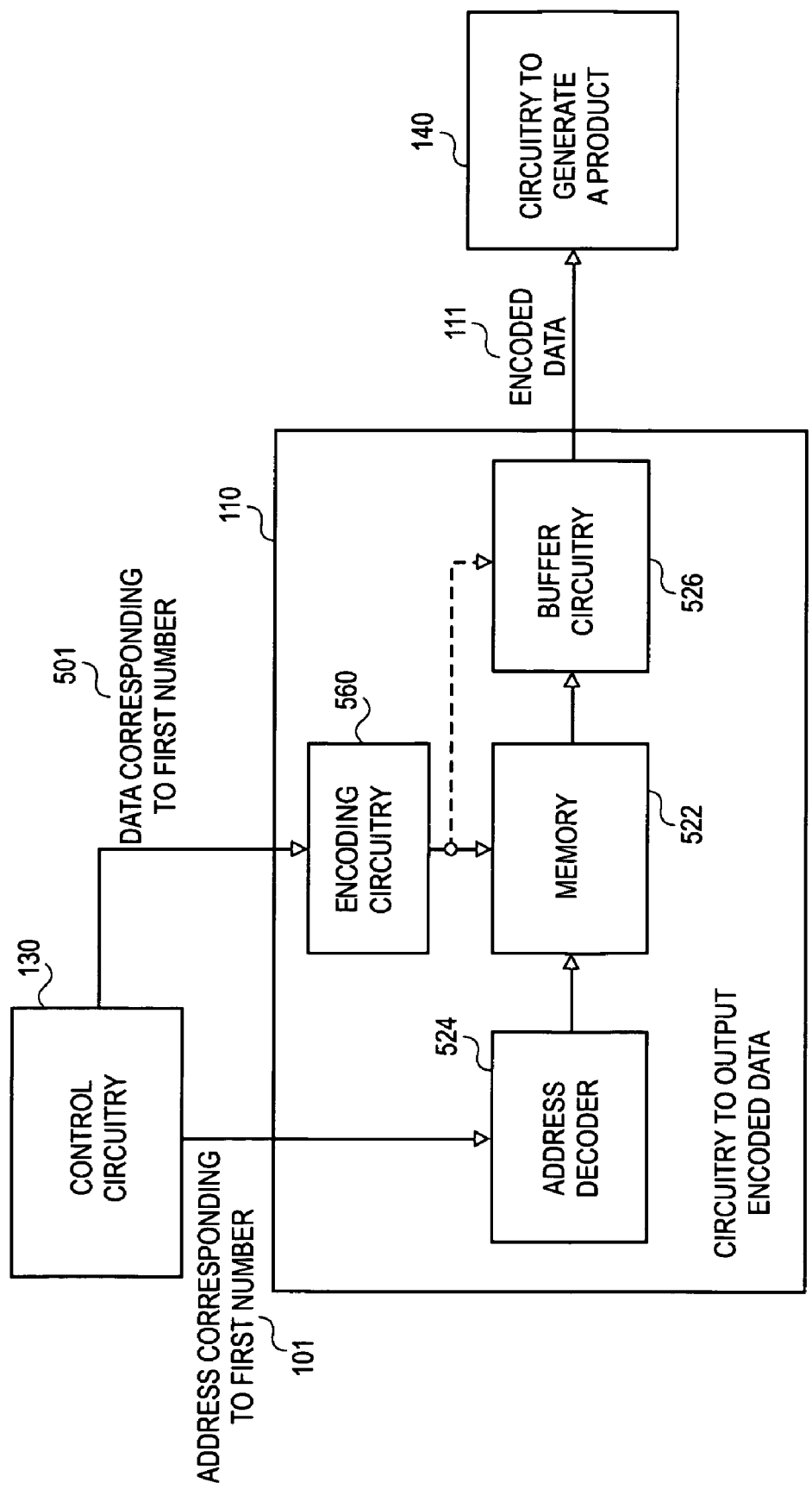
FIG. 5 illustrates, for one embodiment, a block diagram of circuitry to encode data and store encoded data at an addressable location.

Circuitry 110 may be coupled to receive data corresponding to a first number from any suitable source. Such data may have any suitable bit-length. Circuitry 110 for one embodiment, as illustrated in FIG. 5, may be coupled to receive data 501 corresponding to a first number from control circuitry 130. Control circuitry 130 may comprise any suitable circuitry to control output of data 501 to circuitry 110 in any suitable manner. Control circuitry 130 for one embodiment may store data 501 in one or more registers.

Control circuitry 130 for one embodiment may also output to circuitry 110 an address 101 to address a location at which encoded data corresponding to a first number may be stored. Control circuitry 130 for one embodiment may output address 101 and data 501 so as to be available on the same clock edge. Control circuitry 130 for one embodiment may include programmable logic to output address 101 and/or data 501. Control circuitry 130 for one embodiment may output address 101 and/or data 501 in response to an instruction in order to execute the instruction.

Circuitry 110 for one embodiment, as illustrated in FIG. 5, may include encoding circuitry 560 coupled to receive data 501 to encode data 501. Encoding circuitry 560 may include any suitable circuitry to encode data 501 in any suitable manner and to output encoded data to an addressable location. Circuitry 110 for one embodiment, as illustrated in FIG. 5, may include memory 522, and encoding circuitry 560 may be coupled to output encoded data to memory 522 to store encoded data in memory 522. Memory 522 for one embodiment may generally correspond to memory 322 of FIG. 3.

Circuitry 110 for one embodiment, as illustrated in FIG. 5, may include an address decoder 524 coupled to receive and decode at least a portion of a received address to write encoded data to memory 522 and/or to read encoded data from memory 522. Circuitry 110 for another embodiment may not include address decoder 524 but rather may address memory 522 directly using a received address.

Circuitry 110 for one embodiment, as illustrated in FIG. 5, may include buffer circuitry 526 to output encoded data to circuitry 140. Buffer circuitry 526 may include any suitable circuitry coupled to receive encoded data from memory 522 and to store and/or output encoded data in any suitable manner. Buffer circuitry 526 for one embodiment may also include any suitable circuitry coupled to receive encoded data from encoding circuitry 560. Buffer circuitry 526 for one embodiment may successively output portions of encoded data corresponding to a first number to circuitry 140. Buffer circuitry 526 for one embodiment may output all encoded data corresponding to a first number at once to circuitry 140.

Control circuitry 130 for one embodiment may output both an address 101 and data 501 corresponding to a first number for which encoded data is not already stored at an addressable location for output to circuitry 140. Control circuitry 130 for one embodiment may then control circuitry 110 to encode data 501 and store resulting encoded data at a location corresponding to address 101. For subsequent uses of that same first number, control circuitry 130 for one embodiment may output address 101 corresponding to that first number and control circuitry 110 to output the already encoded data from the location corresponding to address 101. In this manner, circuitry 110 for one embodiment may be used to help reduce or avoid having to encode the same data repeatedly for partial product reduction. Control circuitry 130 may include any suitable circuitry to track whether or not encoded data corresponding to a first number is already stored at an addressable location for output to circuitry 140.

Figure 6:
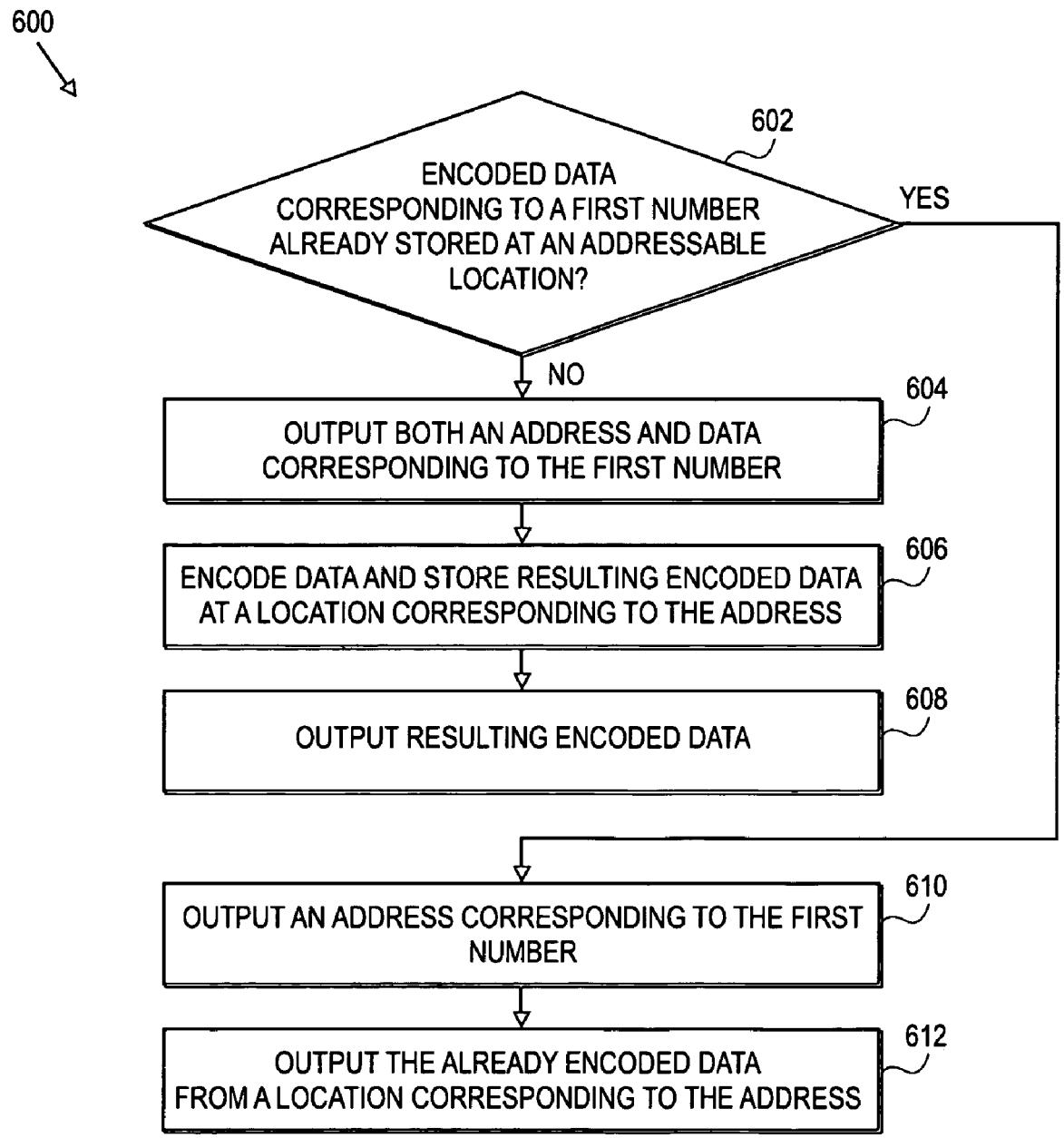
FIG. 6 illustrates, for one embodiment, a flow diagram to output encoded data.

FIG. 6 illustrates, for one embodiment, a flow diagram 600 to output encoded data.

If, for block 602, control circuitry 130 identifies encoded data corresponding to a first number is not already stored at an addressable location for output to circuitry 140, control circuitry 130 for block 604 may output both an address and data corresponding to the first number and for block 606 may control circuitry 110 to encode such data and store resulting encoded data at a location corresponding to the address. Circuitry 110 for block 608 may output resulting encoded data either directly to circuitry 140 or from the addressable location to circuitry 140.

If, for block 602, control circuitry 130 identifies encoded data corresponding to a first number is already stored at an addressable location for output to circuitry 140, control circuitry 130 for block 610 may output an address corresponding to the first number and for block 612 control circuitry 110 to output to circuitry 140 the already encoded data from the location corresponding to the address.

Encoding circuitry 560 for one embodiment may include any suitable circuitry to encode data 501 of any suitable bit-length for partial product reduction in any suitable manner to generate and output encoded data of any suitable size. Data 501 for one embodiment may be 16 bits in length. Encoding circuitry 560 for one embodiment may include any suitable circuitry to encode data 501 of any suitable bit-length to generate and output encoded data that includes any suitable number of sets of any suitable number of select bits.

Figure 7:
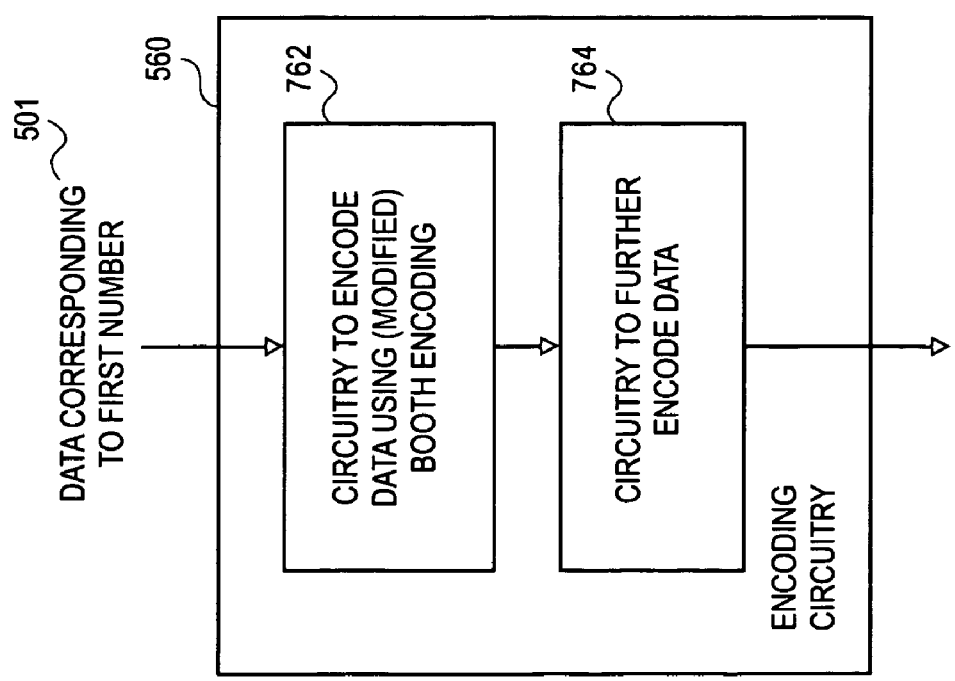
FIG. 7 illustrates, for one embodiment, encoding circuitry for the block diagram of FIG. 5.

Encoding circuitry 560 for one embodiment, as illustrated in FIG. 7, may include circuitry 762 coupled to receive data 501 of any suitable bit-length to encode data 501 using Booth encoding or modified Booth encoding, such as radix-4 Booth (or modified Booth) encoding for example, to generate and output encoded data of any suitable size. Circuitry 762 for one embodiment may use radix-4 Booth (or modified Booth) encoding to encode data 501 that is 16-bits in length to generate encoded data that is 48 bits in length, that is eight sets of six select bits.

Encoding circuitry 560 for one embodiment, as illustrated in FIG. 7, may optionally include circuitry 764 coupled to receive encoded data of any suitable size from circuitry 762 to further encode such encoded data in any suitable manner to generate and output encoded data of any suitable size. Circuitry 764 for one embodiment may include any suitable circuitry to help compress encoded data. Circuitry 764 for one embodiment may encode already encoded data using leading zeroes detection (LZD) or modified LZD. Circuitry 764 for one embodiment may use LZD or modified LZD to encode encoded data having eight sets of six select bits where each set has only one bit that is different from the other bits in the set, such as only one logic one bit in the set for example, to generate eight sets of three encoded select bits for a total of 24 bits of encoded data.

Figure 8:
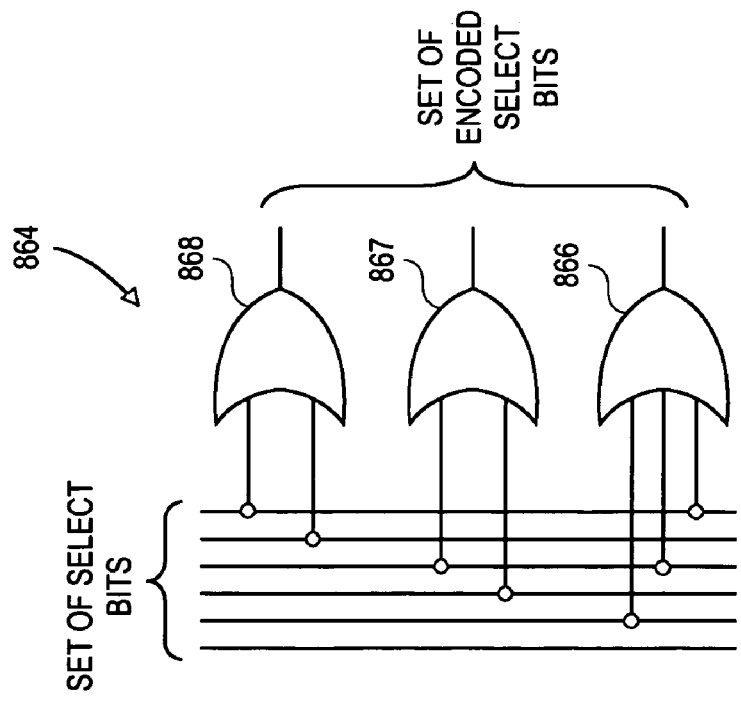
FIG. 8 illustrates, for one embodiment, circuitry to perform modified leading zeroes detection (LZD) for the block diagram of FIG. 7.

Circuitry 764 for one embodiment may include circuitry 864 as illustrated in FIG. 8 to perform modified LZD to encode a set of six select bits having only one logic one bit to generate a set of three encoded select bits. As illustrated in FIG. 8, circuitry 864 may include any suitable circuitry to implement functionality of OR gates 866, 867, and 868. OR gate 866 has as inputs the least significant, third-least significant, and second-most significant bits of a set of six select bits to output a least significant bit of a set of three encoded select bits. OR gate 867 has as inputs the third-least significant and third-most significant bits of the set of six select bits to output a second-least significant bit of the set of three encoded select bits. OR gate 868 has as inputs the least significant and second-least significant bits of the set of six select bits to output a most significant bit of the set of three encoded select bits.

Encoding circuitry 560 for one embodiment may optionally not include or use circuitry 764 but rather may output encoded data directly from circuitry 762.

Circuitry 110 for one embodiment may be designed to output already encoded data corresponding to a first number from an addressable location faster relative to encoding data corresponding to that same first number. Circuitry 110 for one embodiment may then be used to help speed performance of product generation.

Circuitry 110 for one embodiment may be designed to output already encoded data corresponding to a first number from an addressable location with less power consumption and/or heat dissipation relative to encoding data corresponding to that same first number. Circuitry 110 for one embodiment may then be used to help reduce power consumption and/or heat dissipation.

Example System

Circuitry 100 of FIG. 1 may be used to generate a product based at least in part on encoded data from an addressable location in any suitable environment and for any suitable purpose.

Figure 9:
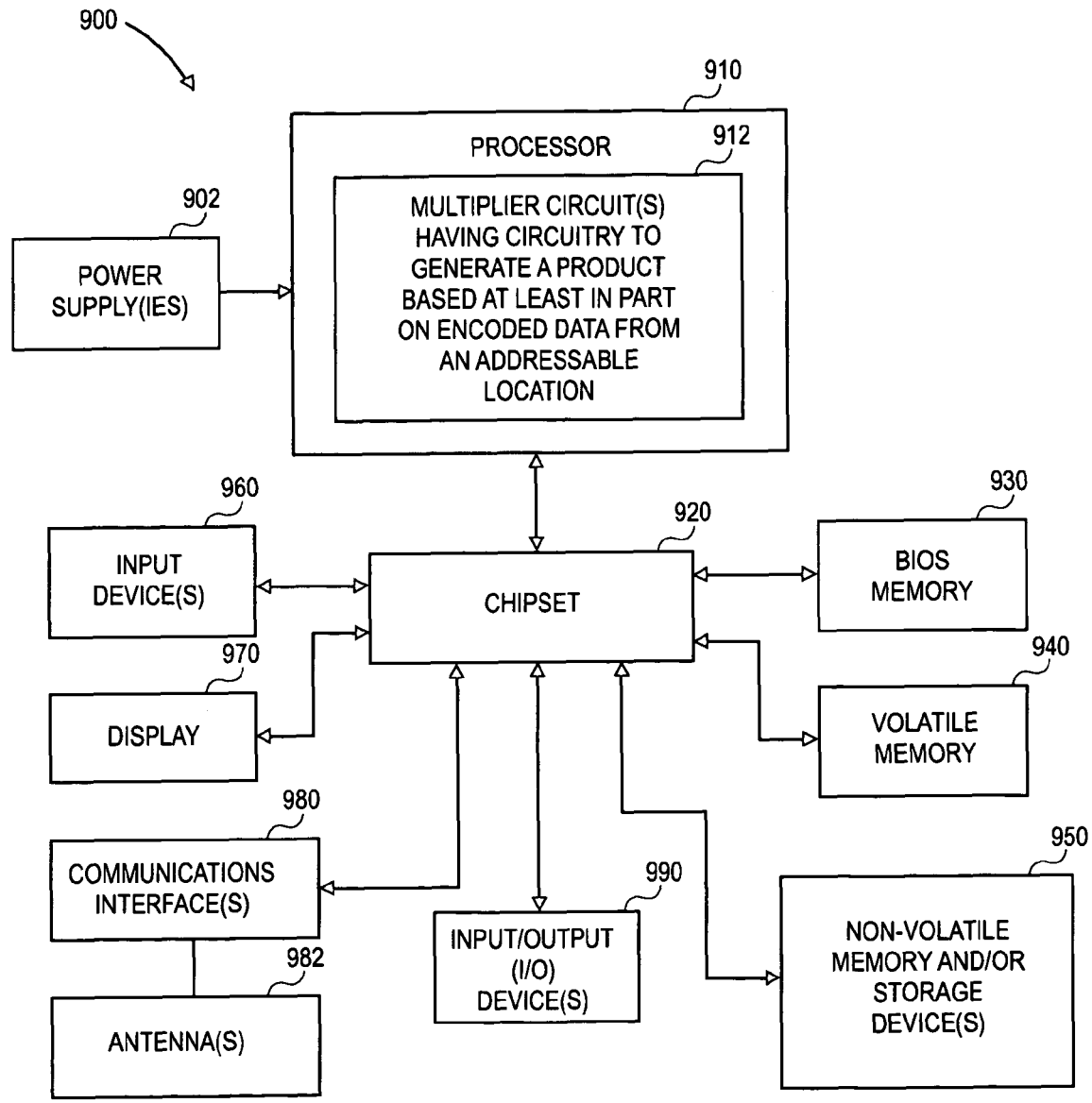
FIG. 9 illustrates, for one embodiment, a block diagram of an example system comprising a processor having circuitry to generate a product based at least in part on encoded data from an addressable location.

FIG. 9 illustrates an example system 900 comprising a processor 910 having one or more multiplier circuits 912 having circuitry 100 to generate a product based at least in part on encoded data from an addressable location. Processor 910 for one embodiment may use one or more multiplier circuits 912, for example, to help perform digital signal processing (DSP) applications such as, for example, finite impulse response (FIR) filters, infinite impulse response (IIR) filters, discrete cosine transforms (DCTs), and/or fast Fourier transforms (FFTs).

System 900 for another embodiment may include multiple processors one or more of which may similarly have one or more multiplier circuits.

Processor 910 for one embodiment may be coupled to receive power from one or more power supplies 902. Power supply(ies) 902 for one embodiment may include one or more energy cells, such as a battery and/or a fuel cell for example. Power supply(ies) 902 for one embodiment may include an alternating current to direct current (AC-DC) converter. Power supply(ies) 902 for one embodiment may include a DC-DC converter.

System 900 for one embodiment may also include a chipset 920 coupled to processor 910, a basic input/output system (BIOS) memory 930 coupled to chipset 920, volatile memory 940 coupled to chipset 920, non-volatile memory and/or storage device(s) 950 coupled to chipset 920, one or more input devices 960 coupled to chipset 920, a display 970 coupled to chipset 920, one or more communications interfaces 980 coupled to chipset 920, and/or one or more other input/output (I/O) devices 990 coupled to chipset 920.

Chipset 920 for one embodiment may include any suitable interface controllers to provide for any suitable communications link to processor 910 and/or to any suitable device or component in communication with chipset 920.

Chipset 920 for one embodiment may include a firmware controller to provide an interface to BIOS memory 930. BIOS memory 930 may be used to store any suitable system and/or video BIOS software for system 900. BIOS memory 930 may include any suitable non-volatile memory, such as a suitable flash memory for example. BIOS memory 930 for one embodiment may alternatively be included in chipset 920.

Chipset 920 for one embodiment may include one or more memory controllers to provide an interface to volatile memory 940. Volatile memory 940 may be used to load and store data and/or instructions, for example, for system 900. Volatile memory 940 may include any suitable volatile memory, such as suitable dynamic random access memory (DRAM) for example.

Chipset 920 for one embodiment may include a graphics controller to provide an interface to display 970. Display 970 may include any suitable display, such as a cathode ray tube (CRT) or a liquid crystal display (LCD) for example. The graphics controller for one embodiment may alternatively be external to chipset 920.

Chipset 920 for one embodiment may include one or more input/output (I/O) controllers to provide an interface to non-volatile memory and/or storage device(s) 950, input device(s) 960, communications interface(s) 980, and/or I/O devices 990.

Non-volatile memory and/or storage device(s) 950 may be used to store data and/or instructions, for example. Non-volatile memory and/or storage device(s) 950 may include any suitable non-volatile memory, such as flash memory for example, and/or may include any suitable non-volatile storage device(s), such as one or more hard disk drives (HDDs), one or more compact disc (CD) drives, and/or one or more digital versatile disc (DVD) drives for example.

Input device(s) 960 may include any suitable input device(s), such as a keyboard, a mouse, and/or any other suitable cursor control device.

Communications interface(s) 980 may provide an interface for system 900 to communicate over one or more networks and/or with any other suitable device. Communications interface(s) 980 may include any suitable hardware and/or firmware. Communications interface(s) 980 for one embodiment may include, for example, a network adapter, a wireless network adapter, a telephone modem, and/or a wireless modem. For wireless communications, communications interface(s) 980 for one embodiment may use one or more antennas 982.

I/O device(s) 990 may include any suitable I/O device(s) such as, for example, an audio device to help convert sound into corresponding digital signals and/or to help convert digital signals into corresponding sound, a camera, a camcorder, a printer, and/or a scanner.

Although described as residing in chipset 920, one or more controllers of chipset 920 may be integrated with processor 910, allowing processor 910 to communicate with one or more devices or components directly. As one example, one or more memory controllers for one embodiment may be integrated with processor 910, allowing processor 910 to communicate with volatile memory 940 directly.

In the foregoing description, example embodiments have been described. Various modifications and changes may be made to such embodiments without departing from the scope of the appended claims. The description and drawings are, accordingly, to be regarded in an illustrative rather than a restrictive sense.

What is claimed is:

1. An apparatus comprising:
   first circuitry to output encoded data from an addressable location based at least in part on an address corresponding to a first number, wherein the encoded data is based at least in part on data that corresponds to the first number and that is encoded for partial product reduction; and
   second circuitry to generate a product of the first number and a second number based at least in part on the encoded data and on data corresponding to the second number.

2. The apparatus of claim 1, wherein the first circuitry includes memory to store encoded data corresponding to different numbers.

3. The apparatus of claim 1, wherein the first circuitry includes encoding circuitry to encode data corresponding to a number and to output encoded data to an addressable location.

4. The apparatus of claim 3, wherein the encoding circuitry is to use Booth or modified Booth encoding.

5. The apparatus of claim 3, wherein the encoding circuitry is to use leading zeroes detection (LZD) or modified LZD.

6. The apparatus of claim 1, wherein the second circuitry includes partial product generation circuitry to generate data corresponding to different potential partial products for data corresponding to the second number.

7. The apparatus of claim 1, wherein the second circuitry includes selection circuitry to select a partial product based at least in part on encoded data.

8. The apparatus of claim 1, wherein the second circuitry includes partial product reduction circuitry.

9. The apparatus of claim 1, wherein the second circuitry includes an adder.

10. The apparatus of claim 1, wherein the first number is a multiplier and the second number is a multiplicand.

11. An apparatus comprising:
    means for outputting encoded data from an addressable location based at least in part on an address corresponding to a first number, wherein the encoded data is based at least in part on data that corresponds to the first number and that is encoded for partial product reduction; and
    means for generating a product of the first number and a second number based at least in part on the encoded data and on data corresponding to the second number.

12. The apparatus of claim 11, wherein the means for outputting encoded data includes means for storing encoded data corresponding to different numbers.

13. The apparatus of claim 11, wherein the means for outputting encoded data includes means for encoding data corresponding to a number.

14. A system comprising:
    one or more energy cells; and
    a processor coupled to receive power from one or more energy cells, the processor having first circuitry to output encoded data from an addressable location based at least in part on an address corresponding to a first number, wherein the encoded data is based at least in part on data that corresponds to the first number and that is encoded for partial product reduction, and second circuitry to generate a product of the first number and a second number based at least in part on the encoded data and on data corresponding to the second number.

15. The system of claim 14, wherein the first circuitry includes memory to store encoded data corresponding to different numbers.

16. The system of claim 14, wherein the first circuitry includes encoding circuitry to encode data corresponding to a number and to output encoded data to an addressable location.

17. The system of claim 14, wherein the second circuitry includes partial product generation circuitry to generate data corresponding to different potential partial products for data corresponding to the second number.

18. The system of claim 14, wherein the second circuitry includes selection circuitry to select a partial product based at least in part on encoded data.

19. The system of claim 14, wherein the second circuitry includes partial product reduction circuitry.

20. The system of claim 14, wherein the second circuitry includes an adder.

* * * * *